(12) United States Patent
Guo et al.

(10) Patent No.: US 11,905,169 B2
(45) Date of Patent: Feb. 20, 2024

(54) ACOUSTIC TRANSDUCTION UNIT, MANUFACTURING METHOD THEREOF AND ACOUSTIC TRANSDUCER

(71) Applicants: Beijing BOE Technology Development Co., Ltd., Beijing (CN); BOE Technology Group Co., Ltd., Beijing (CN)

(72) Inventors: Jingwen Guo, Beijing (CN); Yongchun Tao, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 182 days.

(21) Appl. No.: 17/503,003

(22) Filed: Oct. 15, 2021

(65) Prior Publication Data
US 2022/0289563 A1  Sep. 15, 2022

(30) Foreign Application Priority Data
Mar. 9, 2021 (CN) .......................... 202110257537.6

(51) Int. Cl.
*B81C 1/00* (2006.01)
*B81B 3/00* (2006.01)

(52) U.S. Cl.
CPC ........ *B81C 1/00182* (2013.01); *B81B 3/0021* (2013.01); *B81B 2203/0127* (2013.01); *B81B 2203/0315* (2013.01); *B81B 2203/04* (2013.01)

(58) Field of Classification Search
CPC .............. B81C 1/00182; B81B 3/0021; B81B 2203/0127; B81B 2203/0315; B81B 2203/04
See application file for complete search history.

(56) References Cited

U.S. PATENT DOCUMENTS

2008/0073998 A1  3/2008 Sugiura et al.
2013/0016587 A1  1/2013 Lee
(Continued)

FOREIGN PATENT DOCUMENTS

CN   102884814 A   1/2013
CN   107064266 A   8/2017
(Continued)

OTHER PUBLICATIONS

CN202110239432.8 first office action.
CN202110239432.8 second office action.

*Primary Examiner* — Samuel A Gebremariam
(74) *Attorney, Agent, or Firm* — IPro, PLLC

(57) ABSTRACT

An acoustic transduction unit, a manufacturing method thereof and an acoustic transducer, and relates to the technical field of electronic devices. A first electrode is arranged on a first substrate, a support layer is arranged on a side, close to the first electrode, of the first substrate, and a conductive diaphragm layer is arranged on a side, away from the first substrate, of the support layer; a cavity is enclosed by the support layer, overlapping areas exist between orthographic projections of the first electrode, the conductive diaphragm layer and the cavity on the first substrate, and the conductive diaphragm layer serves as both a diaphragm layer and a second electrode in the acoustic transduction unit, it allows the conductive diaphragm layer to be configured as both the diaphragm layer and the second electrode, a layer structure of the acoustic transduction unit is simple.

19 Claims, 6 Drawing Sheets

(56) References Cited

U.S. PATENT DOCUMENTS

2020/0059738 A1* 2/2020 Liao ................. H01S 3/105
2023/0035383 A1* 2/2023 Naderyan ............ H04R 19/005

FOREIGN PATENT DOCUMENTS

| CN | 209531368 U | 10/2019 |
| CN | 111591951 A | 8/2020 |
| CN | 112115758 A | 12/2020 |
| EP | 3712973 A1 | 9/2020 |

* cited by examiner

ACOUSTIC TRANSDUCTION UNIT, MANUFACTURING METHOD THEREOF AND ACOUSTIC TRANSDUCER

CROSS REFERENCE TO RELEVANT APPLICATIONS

The present application claims the priority of the Chinese patent application filed on Mar. 9, 2021 before the Chinese Patent Office with the application number of 202110257537.6 and the title of "ACOUSTIC TRANSDUCTION UNIT, MANUFACTURING METHOD THEREOF AND ACOUSTIC TRANSDUCER", which is incorporated herein in its entirety by reference.

TECHNICAL FIELD

The disclosure relates to the technical field of electronic devices, in particular to an acoustic transduction unit, a manufacturing method thereof and an acoustic transducer.

BACKGROUND

With the continuous development of science and technology, Capacitive Micromachined Ultrasonic Transducer (CMUT) has been widely used for medical imaging, treatment, industrial flowmeters, automotive radar, indoor positioning, and the like.

SUMMARY

The disclosure provides an acoustic transduction unit, a manufacturing method thereof and an acoustic transducer.

The disclosure discloses an acoustic transduction unit, comprising a first substrate, a first electrode arranged on the first substrate, a support layer arranged on a side, close to the first electrode, of the first substrate, and a conductive diaphragm layer arranged on a side, away from the first substrate, of the support layer;

Wherein a cavity is enclosed by the support layer, overlapping areas exist between orthographic projections of the first electrode, the conductive diaphragm layer and the cavity on the first substrate, and the conductive diaphragm layer serves as both a diaphragm layer and a second electrode in the acoustic transduction unit.

Optionally, the conductive diaphragm layer is made of at least one of graphene or super-aligned carbon nanotubes.

Optionally, a thickness of the conductive diaphragm layer is 5 nm to 100 nm in a direction perpendicular to a plane where the first substrate is located.

Optionally, a shape of the orthographic projection of the first electrode on the first substrate is at least one of rectangle, circle and regular hexagon.

Optionally, a shape of the orthographic projection of the supporting layer on the first substrate is at least one of circular ring or rectangular ring.

Optionally, the acoustic transduction unit further comprises an isolation protective layer, and the isolation protective layer is arranged on a side, close to the conductive diaphragm layer, of the first electrode, and covers the first electrode.

Optionally, the conductive diaphragm layer is provided with through penetrated release holes, and orthographic projections of the release holes in the first substrate are located within the orthographic projection of the cavity on the first substrate.

Optionally, the number of the release holes penetrating through the conductive diaphragm layer is at least one.

Optionally, the acoustic transduction unit further comprises a passivation layer covering the conductive diaphragm layer, and the release holes are filled with the passivation layer; and the acoustic transduction unit further comprises a first signal line arranged on a side, away from the conductive diaphragm layer, of the passivation layer, and the first signal line is connected with the conductive diaphragm layer through a first through hole penetrating through the passivation layer.

Optionally, the first substrate is provided with a second through hole; and the acoustic transduction unit further comprises a second signal line arranged on a side, away from the first electrode, of the first substrate, and the second signal line is connected with the first electrode through the second through hole.

Optionally, an orthographic projection of the second through hole in on the conductive diaphragm layer is located at a center of the conductive diaphragm layer.

The disclosure also discloses a manufacturing method of an acoustic transduction unit, comprising:

forming a first electrode on a first substrate;
forming a support layer on a side, close to the first electrode, of the first substrate, a cavity being enclosed by the support layer; and
forming a conductive diaphragm layer on a side, away from the first substrate, of the support layer;
Wherein overlapping areas exist between orthographic projections of the first electrode, the conductive diaphragm layer and the cavity on the first substrate, and the conductive diaphragm layer serves as both a diaphragm layer and a second electrode in the acoustic transduction unit.

Optionally, the step of forming a conductive diaphragm layer on a side, away from the first substrate, of the support layer comprises:

forming a sacrificial layer on a side, away from the first substrate, of the first electrode;
forming a conductive diaphragm layer on the sacrificial layer, the conductive diaphragm layer being provided with penetrated release holes, and orthographic projections of the release holes in the first substrate being located within an orthographic projection of the sacrificial layer on the first substrate; and
removing the sacrificial layer through the release holes.

Optionally, the step of forming a conductive diaphragm layer on a side, away from the first substrate, of the support layer comprises:

forming a conductive diaphragm layer on a second substrate;
bonding the conductive diaphragm layer formed on the second substrate to a side, away from the first substrate, of the support layer; and
removing the second substrate.

Optionally, after forming a support layer on a side, close to the first electrode, of the first substrate, the method further comprises:

forming a second through hole penetrating through the first substrate; and
forming a second signal line on a side, away from the first electrode, of the first substrate, the second signal line being connected with the first electrode through the second through hole.

The disclosure also discloses an acoustic transducer, comprising a plurality of above acoustic transduction units.

BRIEF DESCRIPTION OF THE DRAWINGS

To describe the technical solutions of the present disclosure more clearly, the accompanying drawings required for describing some embodiments of the present disclosure may be briefly introduced below. Apparently, the accompanying drawings in the following description are merely accompanying drawings of some embodiments of the present disclosure. To those of ordinary skills in the art, other accompanying drawings may also be derived from these accompanying drawings without creative efforts. In addition, the accompanying drawings in the following description may be regarded as schematic diagrams, and are not a limitation on the actual size of the product and the actual process of the method involved in the embodiment of the present disclosure.

DETAILED DESCRIPTION

In order to make the above objects, features and advantages of the disclosure better understood, the disclosure may be described in further detail below with reference to the accompanying drawings and detailed description.

Figure 1:
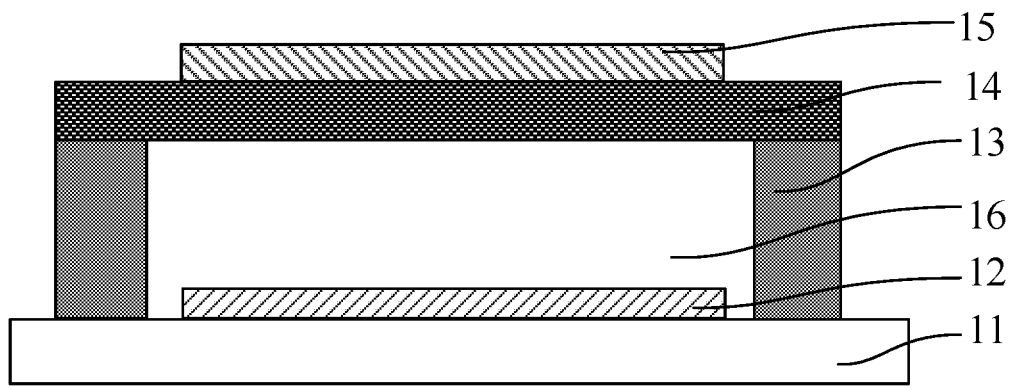
FIG. 1 shows a structural diagram of an acoustic transduction unit in the related art.

In the related art, as shown in FIG. 1, an acoustic transduction unit comprises a substrate 11, a first electrode 12, a support layer 13, a diaphragm layer 14 and a second electrode 15, and a cavity 16 is enclosed by the support layer 13.

The diaphragm layer 14 is usually made of insulating materials such as silicon nitride or silicon oxide, and the second electrode 15 is usually made of conductive materials such as aluminum and indium tin oxides (ITO), that is, the diaphragm layer 14 and the second electrode 15 are two independent layers, which leads to a complicated layer structure of the acoustic transduction unit.

In addition, in the actual manufacturing process, the diaphragm layer 14 is formed by a solely single patterning process, and the second electrode 15 is also formed by a solely single patterning process. Therefore, the diaphragm layer 14 and the second electrode 15 need to be formed by two patterning processes, resulting in many manufacturing steps of the acoustic transduction unit and high costs of production.

Therefore, in the embodiment of the disclosure, by integrating the diaphragm layer and the second electrode in the acoustic transduction unit into one and allowing the conductive diaphragm layer to be used as both the diaphragm layer and the second electrode, a layer structure of the acoustic transduction unit is simple, so that the manufacturing steps of the acoustic transduction unit are simplified and production cost is reduced.

Figure 2:
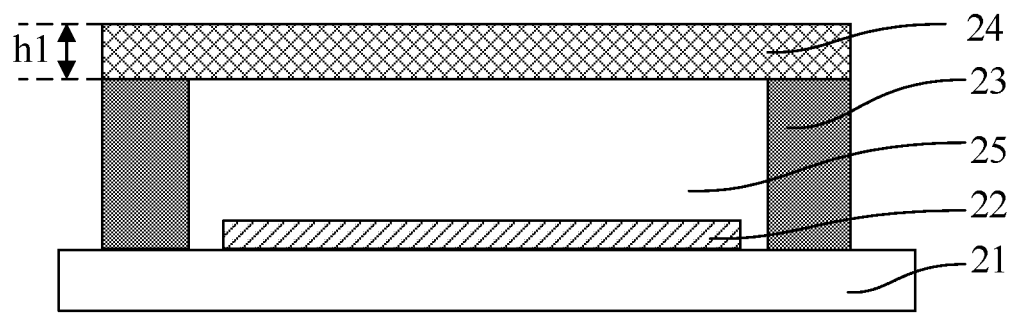
FIG. 2 shows a structural diagram of an acoustic transduction unit according to an embodiment of the disclosure.

FIG. 2 shows a structural diagram of an acoustic transduction unit according to an embodiment of the disclosure.

The embodiment of the disclosure provides an acoustic transduction unit, which comprises a first substrate 21, a first electrode 22 arranged on the first substrate 21, a support layer 23 arranged on a side, close to the first electrode 22, of the first substrate 21, and a conductive diaphragm layer 24 arranged on a side, away from the first substrate 21, of the support layer 23; wherein a cavity 25 is enclosed by the support layer 23, overlapping areas exist between orthographic projections of the first electrode 22, the conductive diaphragm layer 24 and the cavity 25 on the first substrate 21, and the conductive diaphragm layer 24 serves as both a diaphragm layer and a second electrode in the acoustic transduction unit.

In actual products, the first substrate 21 is a glass substrate. Certainly, the first substrate 21 may also be other substrates such as a silicon-based substrate. Compared with the silicon-based substrate, the glass substrate has a lower cost. Therefore, when the glass substrate is used as the first substrate 21, the manufacturing cost of the acoustic transduction unit may be reduced.

The first substrate 21 is provided with the first electrode 22, and the first electrode 22 refers to a bottom electrode of the acoustic transduction unit. The first electrode 22 is made of conductive materials, for example, the first electrode 22 may be made of one or more of metal materials such as molybdenum, aluminum, copper, gold and nickel. Certainly, the first electrode 22 may also be made of oxide conductive materials such as ITO.

In addition, the acoustic transduction unit further comprises the support layer 23 arranged on the side, close to the first electrode 22, of the first substrate 21, and the cavity 25 is enclosed by the support layer 23. The support layer 23 is made of insulating materials, which may be inorganic insulating materials such as silicon nitride or silicon oxide, or organic insulating materials such as PI (Polyimide).

Specifically, the support layer 23 may be directly arranged on the first substrate 21. In this case, the first electrode 22 and the support layer 23 are arranged on a same layer, and the support layer 23 surrounds the first electrode 22, that is, no overlapping area exists between an orthographic projection of the first electrode 22 on the first substrate 21 and an orthographic projection of the support layer 23 on the first substrate 21. The support layer 23 may also be arranged on a side, away from the first substrate 21, of the first electrode 22. In this case, the orthographic projection of the support layer 23 on the first substrate 21 is located in the orthographic projection of the first electrode 22 on the first substrate 21, specifically, the orthographic projection of the support layer 23 on the first substrate 21 is located in an edge area of the orthographic projection of the first electrode 22 on the first substrate 21, that is, the support layer 23 forms a circle in an edge area of a surface of the first electrode 22.

In addition, the conductive diaphragm layer 24 is arranged on the side, away from the first substrate 21, of the support layer 23. In order to allow the support layer 23 to support the conductive diaphragm layer 24, an overlapping area exists between an orthographic projection of the conductive diaphragm layer 24 on the first substrate 21 and an orthographic projection of the support layer 23 on the first substrate 21, that is, a contact area exists between the conductive diaphragm layer 24 and the support layer 23, so that the support layer 23 may support the conductive diaphragm layer 24. Besides, since the cavity 25 is enclosed by the support layer 23, that is, the support layer 23 is arranged at a periphery of the cavity 25, the orthographic projection of the conductive diaphragm layer 24 on the first substrate 21 covers the orthographic projection of the cavity 25 on the first substrate 21. In addition, an overlapping area also exists between the orthographic projection of the conductive diaphragm layer 24 on the first substrate 21 and the orthographic projection of the first electrode 22 on the first substrate 21, so that a capacitor is formed between the first electrode 22 and the conductive diaphragm layer 24.

Specifically, when the first electrode 22 and the support layer 23 are arranged on a same layer, and no overlapping area exists between the orthographic projection of the first electrode 22 on the first substrate 21 and the orthographic projection of the support layer 23 on the first substrate 21, since the cavity 25 is enclosed by the support layer 23, the orthographic projection of the first electrode 22 on the first substrate 21 completely coincides with the orthographic projection of the cavity 25 on the first substrate 21, or, the orthographic projection of the first electrode 22 on the first substrate 21 is located within the orthographic projection of the cavity 25 on the first substrate 21. When the support layer 23 is arranged on the side, away from the first substrate 21, of the first electrode 22, and the orthographic projection of the support layer 23 on the first substrate 21 is located within the orthographic projection of the first electrode 22 on the first substrate 21, the orthographic projection of the first electrode 22 on the first substrate 21 covers the orthographic projection of the cavity 25 on the first substrate 21.

In actual products, the cavity 25 is enclosed by the support layer 23, and is located between the first electrode 22 and the conductive diaphragm layer 24. The cavity 25 may be a vacuum or contains a certain amount of gas, such as air. When the first electrode 22 and the support layer 23 are arranged on the first substrate 21 on the same layer, it is necessary to ensure that a thickness of the support layer 23 is greater than that of the first electrode 22 in a direction perpendicular to a plane where the first substrate 21 is located, so as to enclose the cavity 25.

In addition, the conductive diaphragm layer 24 serves as both the diaphragm layer and the second electrode (top electrode) in the acoustic transduction unit, that is, the diaphragm layer and the second electrode in the acoustic transduction unit are integrated into one, and only the conductive diaphragm layer 24 is adopted to serve as both the diaphragm layer and the second electrode.

When the conductive diaphragm layer 24 serves as both the diaphragm layer and the second electrode in the acoustic transduction unit, a layer structure of the acoustic transduction unit is simple, that is, compared with a two-layer structure of the diaphragm layer 14 and the second electrode 15 in FIG. 1, the embodiment of the disclosure only needs one layer, that is, the conductive diaphragm layer 24. Accordingly, the diaphragm layer 14 and the second electrode 15 need to be formed by two patterning processes; however, in this embodiment of the disclosure, since the conductive diaphragm layer 24 serves as both the diaphragm layer and the second electrode, only one patterning process is required to form the conductive diaphragm layer 24, thus saving one patterning process, i.e., one coating procedure and one mask procedure, simplifying the manufacturing of the acoustic transduction unit, and reducing the production cost.

In actual use, the acoustic transduction unit may be used as both a transmitter and a receiver.

When the acoustic transduction unit is used as a transmitter, an alternating voltage is applied between the first electrode 22 and the conductive diaphragm layer 24, which causes the electric field of the capacitor formed between the first electrode 22 and the conductive diaphragm layer 24 to change, so that the conductive diaphragm layer 24 makes a significant reciprocating motion under the changing electric field, that is, a reciprocating motion toward and away from the first electrode 22, so as to realize the conversion from electrical energy to mechanical energy. When the conductive diaphragm layer 24 is in a vibrating state, the conductive diaphragm layer 24 may radiate energy to a medium environment, thereby generating acoustic waves, which may be ultrasonic waves with a vibration frequency greater than or equal to 20 KHz. If the acoustic transduction unit is used for acoustic detection, part of the acoustic waves may be transmitted to a surface of an object to be detected, and the acoustic waves may be reflected on the surface of the object to be detected, so as to be reflected back to the acoustic transduction unit for receiving and detection by the acoustic transduction unit.

When the acoustic transduction unit is used as a receiver, if acoustic waves act on the conductive diaphragm layer 24, the conductive diaphragm layer 24 vibrates, and the space of the cavity between the first electrode 22 and the conductive diaphragm layer 24 changes, thus causing the capacitance corresponding to the capacitor formed between the first electrode 22 and the conductive diaphragm layer 24 to change, thereby generating an electrical signal, based on which the received acoustic waves may be detected.

Therefore, using the conductive diaphragm layer 24 as both the diaphragm layer and the second electrode in the acoustic transduction unit may ensure that the acoustic transduction unit works normally while simplifying the layer structure and manufacturing of the acoustic transduction unit.

In the embodiment of the disclosure, the conductive diaphragm layer 24 is made of graphene or super-aligned carbon nanotubes.

Since carbon-based materials have low density, high mechanical strength and good electrical conductivity, using graphene or super-aligned carbon nanotubes as the material of the conductive diaphragm layer 24 may improve the working frequency of the acoustic transduction unit and realize high-frequency application, for example, the acoustic transduction unit may be applied to technical fields requiring high-frequency working frequency, such as ultrasonic eye detection.

In the embodiment of the disclosure, in the direction perpendicular to the plane where the first substrate 21 is located, a thickness h1 of the conductive diaphragm layer 24 is 5 nm to 100 nm. For example, the thickness h1 of the conductive diaphragm layer 24 is 10 nm, 20 nm, 50 nm, etc.

In actual products, a shape of the orthographic projection of the first electrode 22 on the first substrate 21 may be any one of rectangle, circle and regular hexagon. Certainly, the orthographic projection of the first electrode 22 on the first substrate 21 is not limited to the above-mentioned shapes, but may also be irregular. Accordingly, a shape of the orthographic projection of the conductive diaphragm layer 24 on the first substrate 21 may also be any one of rectangle, circle and regular hexagon. Certainly, the orthographic projection of the conductive diaphragm layer 24 on the first substrate 21 is not limited to the above shapes, and but may also be irregular.

The orthographic projection of the support layer 23 on the first substrate 21 is annular, such as a circular ring or a rectangular ring. When the orthographic projection of the support layer 23 on the first substrate 21 is a circular ring, the orthographic projection of the cavity 25 on the first substrate 21 is circular. When the orthographic projection of the support layer 23 on the first substrate 21 is a rectangular ring, the orthographic projection of the cavity 25 on the first substrate 21 is rectangular.

Figure 3:
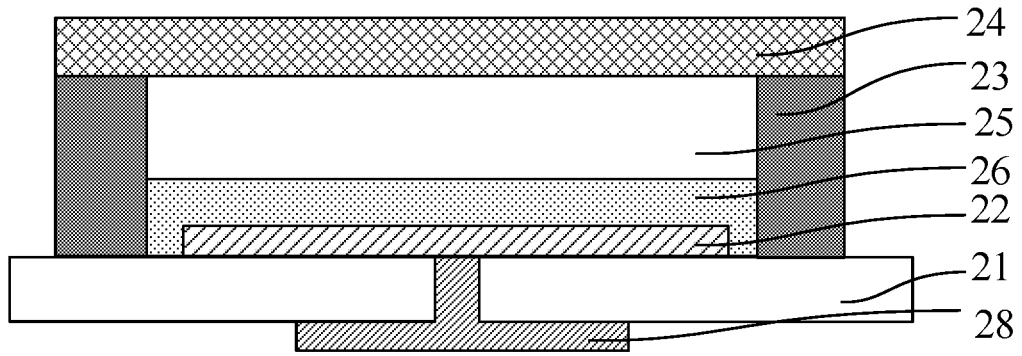
FIG. 3 shows a structural diagram of another acoustic transduction unit according to an embodiment of the disclosure.
Figure 4:
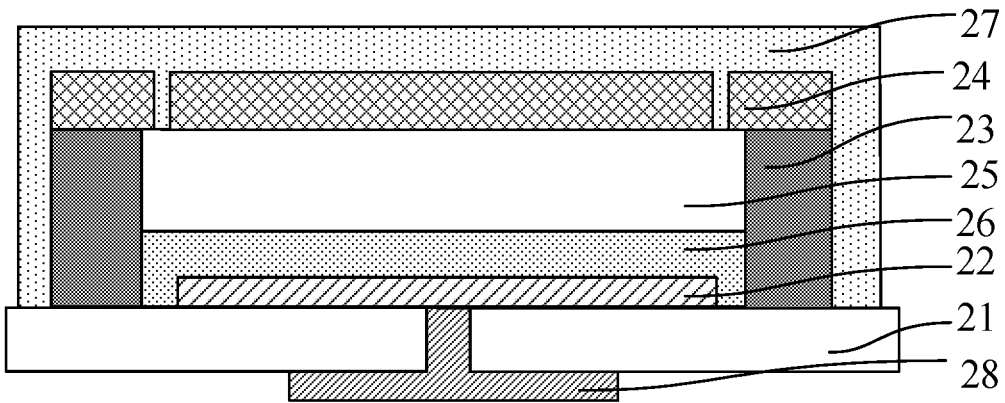
FIG. 4 shows a structural diagram of yet another acoustic transduction unit according to an embodiment of the disclosure.

FIG. 3 shows a structural diagram of another acoustic transduction unit according to an embodiment of the disclosure, and FIG. 4 shows a structural diagram of yet another acoustic transduction unit according to an embodiment of the disclosure.

As shown in FIGS. 3 and 4, the acoustic transduction unit further comprises an isolation protective layer 26, and the isolation protective layer 26 is arranged on a side, close to the conductive diaphragm layer 24, of the first electrode 22 and covers the first electrode 22.

The isolation protective layer 26 is made of insulating materials, which may be inorganic insulating materials, such as silicon nitride or silicon oxide, or organic insulating materials, such as PI.

When the conductive diaphragm layer 24 is in a vibrating state, a vibrating amplitude of the conductive diaphragm layer 24 may be very large, so that a distance between the conductive diaphragm layer 24 and the first electrode 22 is short. If the isolation protective layer 26 covering the first electrode 22 is not provided, electro-discharge may occur for the conductive diaphragm layer 24 and the first electrode 22, thus affecting the vibrating effect of the conductive diaphragm layer 24. Therefore, by providing the isolation protective layer 26 covering the first electrode 22, electro-discharge caused by excessive vibration of the conductive diaphragm layer 24 may be effectively avoided.

In addition, during the manufacturing of the acoustic transduction unit, a sacrificial layer may be used to manufacture the conductive diaphragm layer 24. The sacrificial layer in the cavity 25 needs to be removed by an etching solution subsequently. In order to avoid the damage of the etching solution to the first electrode 22, the isolation protective layer 26 covering the first electrode 22 is required to protect the first electrode 22 from the etching solution.

It should be noted that when the first electrode 22 and the support layer 23 are arranged on the first substrate 21 on the same layer and the isolation protective layer 26 covers the first electrode 22, it is necessary to ensure that the thickness of the support layer 23 is greater than the sum of thicknesses of the first electrode 22 and the isolation protective layer 26 in the direction perpendicular to the plane where the first substrate 21 is located so as to form the cavity 25. In this case, the orthographic projection of the support layer 23 on the first substrate 21 does not overlap with an orthographic projection of the isolation protective layer 26 on the first substrate 21, and the support layer 23 also surrounds the isolation protective layer 26.

In addition, when the isolation protective layer 26 covering the first electrode 22 is provided in the acoustic transduction unit, the support layer 23 may also be arranged on a side, away from the first electrode 22, of the isolation protective layer 26, and the orthographic projection of the support layer 23 on the first substrate 21 is located within the orthographic projection of the isolation protective layer 26 on the first substrate 21.

Figure 5:
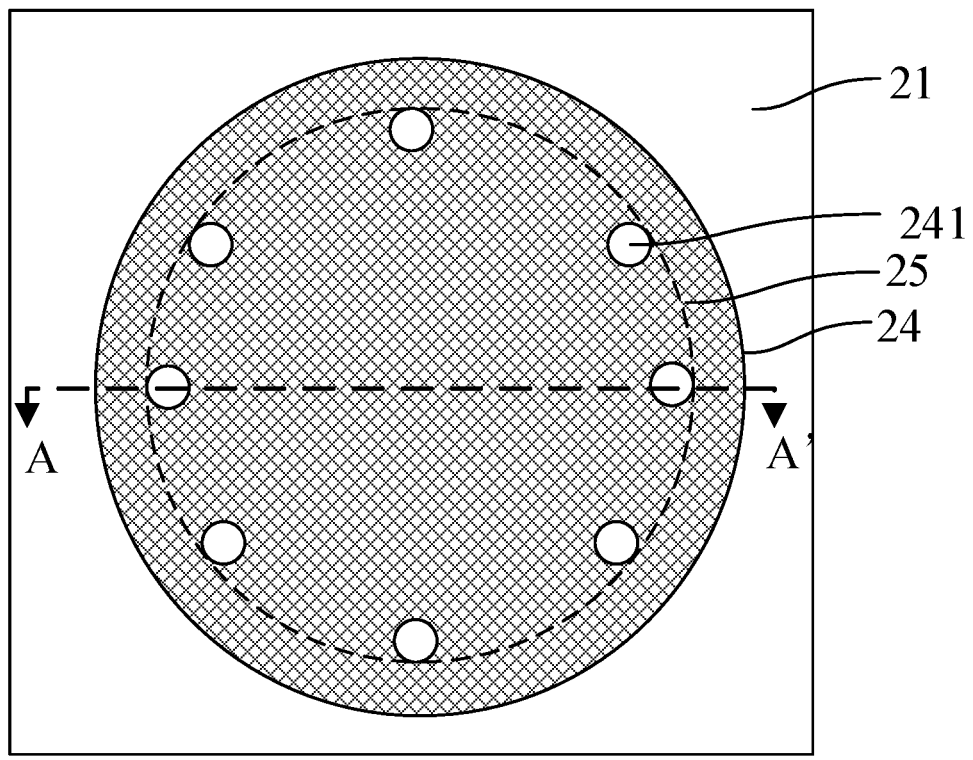
FIG. 5 shows a plan view corresponding to the acoustic transduction unit shown in FIG. 4.

Optionally, as shown in FIGS. 4 and 5, the conductive diaphragm layer 24 is provided with penetrated release holes 241, and orthographic projections of the release holes 241 in the first substrate 21 are located within the orthographic projection of the cavity 25 on the first substrate 21.

During the manufacturing of the acoustic transduction unit, the sacrificial layer is formed on the side, away from the first electrode 22, of the isolation protective layer 26, and then the conductive diaphragm layer 24 is formed on the sacrificial layer. In this case, the support layer 23, the conductive diaphragm layer 24 and the isolation protective layer 26 may form a closed structure. To remove the sacrificial layer in the closed structure, it is necessary to form the release holes 241 penetrating through the conductive diaphragm layer 24, and then the etching solution may flow to the sacrificial layer through the release holes 241 to etch the sacrificial layer, so as to form the cavity 25 after etching.

In order to ensure that the sacrificial layer is etched by the etching solution, before the sacrificial layer is etched, the orthographic projections of the release holes 241 on the first substrate 21 are located in the orthographic projection of the sacrificial layer on the first substrate 21. After the sacrificial layer is etched to form the cavity 25, the orthographic projections of the release holes 241 on the first substrate 21 are located in the orthographic projection of the cavity 25 on the first substrate 21.

Specifically, the number of the release holes 241 penetrating through the conductive diaphragm layer 24 is at least one. As shown in FIG. 5, the number of the release holes 241 penetrating through the conductive diaphragm layer 24 is eight, and the orthographic projections of the release holes 241 in the first substrate 21 are located in an edge area of the orthographic projection of the cavity 25 in the first substrate 21.

It should be noted that a sectional view taken along the section A-A' shown in FIG. 5 is shown in FIG. 4. In order to clearly show the positional relationship of the release holes 241, a layer structure of a passivation layer 27 is not shown in the plan view shown in FIG. 5.

As shown in FIG. 4, the acoustic transduction unit further comprises a passivation layer 27 covering the conductive diaphragm layer 24, and the release holes 241 are filled with the passivation layer 27. The acoustic transduction unit further comprises a first signal line (not shown in FIG. 4) arranged on a side, away from the conductive diaphragm layer 24, of the passivation layer 27, and the first signal line is connected with the conductive diaphragm layer 24 through a first through hole penetrating through the passivation layer 27.

In some products, it is necessary to ensure that the cavity 25 is a vacuum. Therefore, the release holes 241 penetrating through the conductive diaphragm layer 24 need to be filled, so that the passivation layer 27 covering the conductive diaphragm layer 24 is formed, and the release holes 241 are filled with the passivation layer 27, so as to form a closed structure in the acoustic transduction unit. The passivation layer 27 is made of insulating materials, such as silicon nitride or silicon oxide.

In addition, the passivation layer 27 is provided with the first through hole, the first signal line is arranged on the side, away from the conductive diaphragm layer 24, of the passivation layer 27, and the first signal line is connected with the conductive diaphragm layer 24 through the first through hole.

The first signal line is also connected with a first signal terminal, and is used for providing a first signal input by the first signal terminal for the conductive diaphragm layer 24, so as to control the conductive diaphragm layer 24 to vibrate and generate acoustic waves under the action of a second signal provided for the first electrode 22 at the same time. The first signal terminal is a fixed voltage terminal, such as a ground terminal.

It should be noted that the passivation layer covering the conductive diaphragm layer 24 may also be arranged in the acoustic transduction unit shown in FIG. 3. In this case, the conductive diaphragm layer 24 is not provided with penetrated release holes 241, and the passivation layer may not fill the release holes 241. In addition, the first signal line is also arranged on the side, away from the conductive diaphragm layer 24, of the passivation layer, and the first signal line is connected with the conductive diaphragm layer 24 through the first through hole penetrating through the passivation layer.

In the embodiment of the disclosure, as shown in FIGS. 3 and 4, the first substrate 21 is provided with a second through hole. The acoustic transduction unit further comprises a second signal line 28 arranged on a side, away from the first electrode 22, of the first substrate 21, and the second signal line 28 is connected with the first electrode 22 through the second through hole.

In the related art, wires connected with a bottom electrode are usually arranged on a side, away from the first substrate 21, of a top electrode, but this wiring manner makes the wires on the side, away from the first substrate 21, of the top electrode very complicated. In order to simplify the wiring design, a Through Glass Via (TGV) technology is adopted to form the second through hole penetrating through the first substrate 21, then the second signal line 28 is formed on the side, away from the first electrode 22, of the first substrate 21, and a material of the second signal line 28 fills the second through hole and is connected with the first electrode 22, so that the first electrode 22 is led out to the side, away from the first electrode 22, of the first substrate 21 through the second through hole.

By connecting the first electrode 22 with the second signal line 28 on the side, away from the first electrode 22, of the first substrate 21 through the second through hole, the wiring design of the acoustic transduction unit may be simplified and optimized, so that the arrangement density of the acoustic transduction units in an acoustic transducer is improved. When the arrangement density of the acoustic transduction units in the acoustic transducer increases, the number of the acoustic transduction units per unit area increases, thus improving the transmitting sound pressure and receiving sensitivity of the acoustic transducer. In addition, parasitic capacitance caused by unreasonable wiring (for example, wiring distance is too short) on the side, away from the first substrate 21, of the top electrode may be effectively avoided, thereby improving the electrical performance of the acoustic transducer.

In actual products, the second signal line 28 is connected with a second signal terminal, and used to provide a second signal input by the second signal terminal to the first electrode 22. The first signal line provides the first signal input by the first signal terminal to the conductive diaphragm layer 24. In this case, the first electrode 22 and the conductive diaphragm layer 24 may generate an electric field, which may cause the conductive diaphragm layer 24 to vibrate under the action of the electric field to generate acoustic waves.

Further, the second signal terminal is connected with a detection chip, the second signal line 28 is also used to send an electrical signal generated by the vibration of the conductive diaphragm layer 24 to the second signal terminal, and the second signal terminal sends the electrical signal to the detection chip to detect the acoustic waves received by the conductive diaphragm layer 24.

The first signal line and the second signal line 28 are made of conductive materials, such as one or more of metal materials such as molybdenum, aluminum, copper, gold and nickel.

In the embodiment of the disclosure, an orthographic projection of the second through hole in the conductive diaphragm layer 24 is located at a center of the conductive diaphragm layer 24.

The symmetry and vibration stability of the acoustic transduction unit may be improved by arranging the orthographic projection of the second through hole connected between the second signal line 28 and the first electrode 22 on the conductive diaphragm layer 24 at the center of the conductive diaphragm layer 24.

For example, when the orthographic projection of the conductive diaphragm layer 24 on the first substrate 21 is circular, the orthographic projection of the second through hole in the conductive diaphragm layer 24 is located at a circle center of the conductive diaphragm layer 24.

In the embodiment of the disclosure, by integrating the diaphragm layer and the second electrode in the acoustic transduction unit into one and allowing the conductive diaphragm layer to be used as both the diaphragm layer and the second electrode, a layer structure of the acoustic transduction unit is simple, so that the manufacturing steps of the acoustic transduction unit are simplified and the cost of production is reduced.

Figure 6:
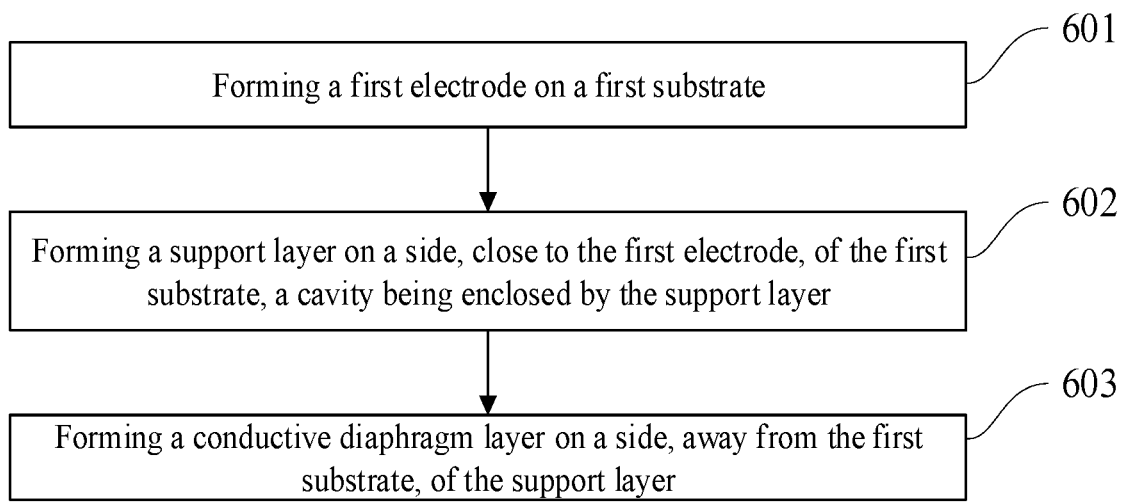
FIG. 6 shows a flowchart of a manufacturing method of an acoustic transduction unit according to an embodiment of the disclosure.

FIG. 6 shows a flowchart of a manufacturing method of an acoustic transduction unit according to an embodiment of the disclosure, and the method may specifically comprise the following steps:

Step 601, forming a first electrode on a first substrate.

Figure 7:
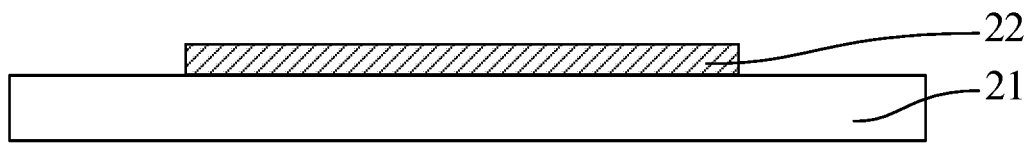
FIG. 7 shows a structural diagram of an embodiment of the disclosure after a first electrode is formed on a first substrate.

In the embodiment of the disclosure, as shown in FIG. 7, a first substrate 21, which may be a glass substrate, is provided, and then a first electrode 22 is formed on the first substrate 21 by a single patterning process.

It should be noted that the patterning process specifically comprises film coating, photoresist coating, exposure, development, film etching, photoresist stripping and the like.

Step 602, forming a support layer on a side, close to the first electrode, of the first substrate, a cavity being enclosed by the support layer.

Figure 8:
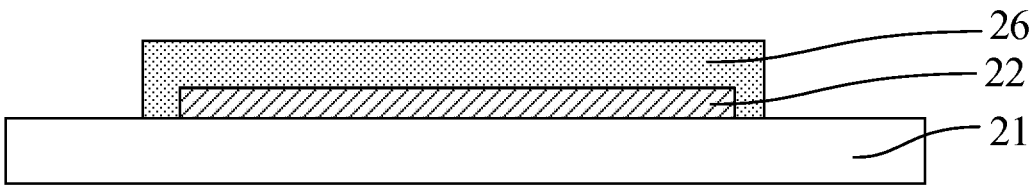
FIG. 8 shows a structural diagram of an embodiment of the disclosure after an isolation protective layer covering a first electrode is formed.
Figure 9:
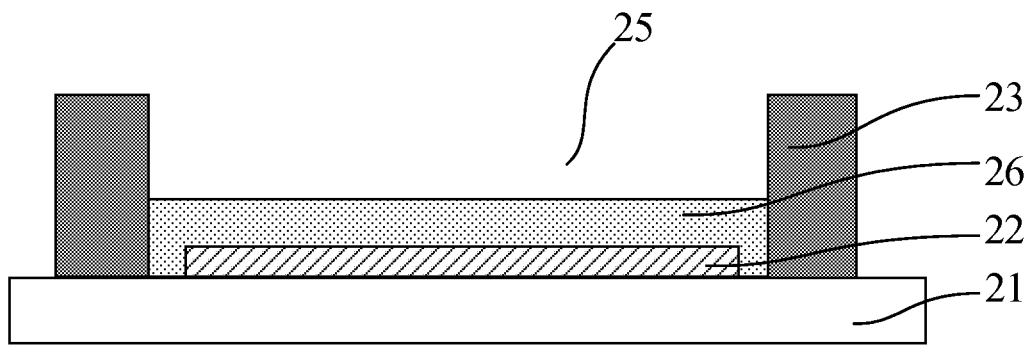
FIG. 9 shows a structural diagram of an embodiment of the disclosure after a support layer is formed.

In the embodiment of the disclosure, as shown in FIG. 8, after the first electrode 22 is formed on the first substrate 21, an isolation protective layer 26 covering the first electrode 22 may be formed by a single patterning process, then, as shown in FIG. 9, a support layer 23 is formed on a side, close to the first electrode 22, of the first substrate 21 by a single patterning process, and a cavity 25 is enclosed by the support layer 23. Specifically, the support layer 23 may be formed on the first substrate 21 on a same layer as the first electrode 22, or on a side, away from the first electrode 22, of the isolation protective layer 26.

Certainly, after the first electrode 22 is formed on the first substrate 21, the support layer 23 may also be directly formed by a single patterning process. In this case, the support layer 23 may be formed on the first substrate 21 on the same layer as the first electrode 22, or on a side, away from the first substrate 21, of the first electrode 22.

Step 603, forming a conductive diaphragm layer on a side, away from the first substrate, of the support layer.

In the embodiment of the disclosure, after the support layer 23 is formed on the side, close to the first electrode 22, of the first substrate 21, a conductive diaphragm layer 24 is formed on a side, away from the first substrate 21, of the support layer 23. Overlapping areas exist between orthographic projections of the first electrode 22, the conductive diaphragm layer 24 and the cavity 25 on the first substrate 21, and the conductive diaphragm layer 24 serves as both a diaphragm layer and a second electrode in the acoustic transduction unit.

In an alternative embodiment of the disclosure, step 603 comprises sub-steps 6031 to 6033:

Sub-step 6031, forming a sacrificial layer on a side, away from the first substrate, of the first electrode;

Sub-step 6032, forming a conductive diaphragm layer on the sacrificial layer, the conductive diaphragm layer being provided with penetrated release holes, and orthographic projections of the release holes in the first substrate being located within an orthographic projection of the sacrificial layer on the first substrate; and Sub-step 6033, removing the sacrificial layer through the release holes.

Figure 10:
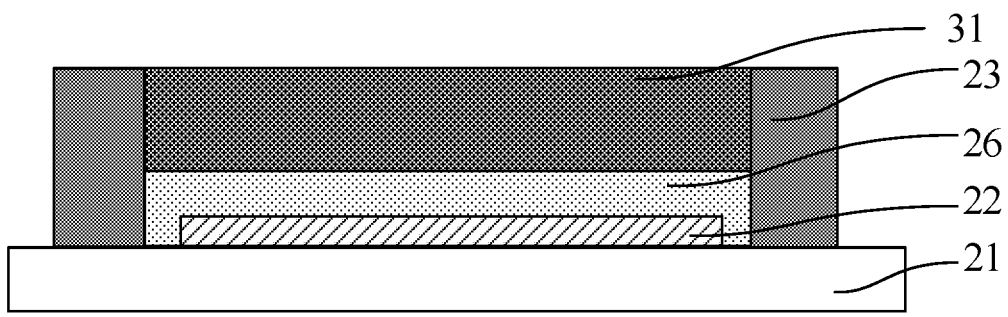
FIG. 10 shows a structural diagram after a sacrificial layer is formed on the structure shown in FIG. 9.

As shown in FIG. 10, after the support layer 23 is formed on the side, close to the first electrode 22, of the first substrate 21, a sacrificial layer 31 is formed on a side, away from the first substrate 21, of the first electrode 22 by a single patterning process, and specifically, the sacrificial layer 31 is formed on a surface of a side, away from the first substrate 21, of the isolation protective layer 26. The sacrificial layer 31 is made of copper. Certainly, other materials may be used for the sacrificial layer 31. A thickness of the sacrificial layer 31 may be determined according to thicknesses of the support layer 23, the first electrode 22 and the isolation protective layer 26, for example, the sum of the thicknesses of the sacrificial layer 31, the first electrode 22 and the isolation protective layer 26 is equal to the thickness of the support layer 23.

Figure 11:
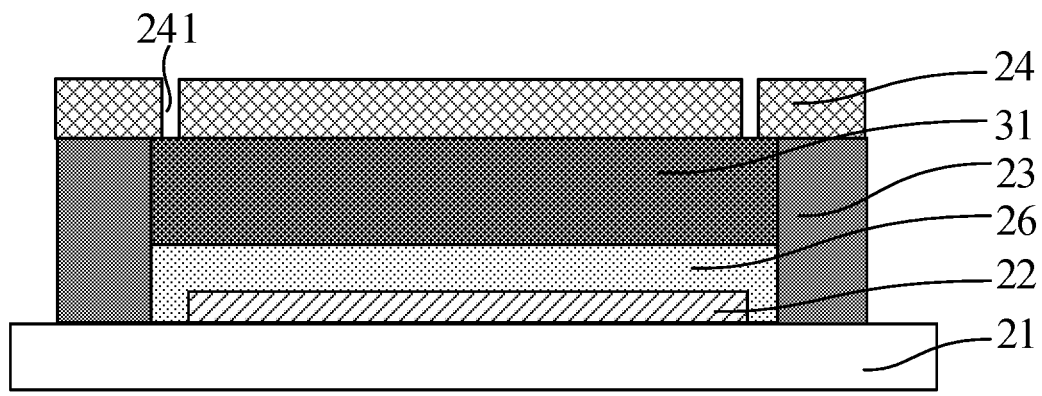
FIG. 11 shows a structural diagram after a conductive diaphragm layer is formed on the structure shown in FIG. 10.

As shown in FIG. 11, after the sacrificial layer 31 is formed on the side, away from the first substrate 21, of the first electrode 22, a conductive diaphragm layer 24 is formed on a surface of a side, away from the first substrate 21, of the sacrificial layer 31 by a single patterning process, and the conductive diaphragm layer 24 may extend to a position where the support layer 23 is located. In addition, when the conductive diaphragm layer 24 is formed by the patterning process, release holes 241 penetrating through the conductive diaphragm layer 24 are formed, and orthographic projections of the release holes 241 on the first substrate 21 are located within an orthographic projection of the sacrificial layer 31 on the first substrate 21.

It should be noted that when copper is used as the material of the sacrificial layer 31, a high-quality large-area graphene film or super-aligned carbon nanotube film may be grown on a surface of the sacrificial layer 31 by a Chemical Vapor Deposition (CVD) process, so that the conductive diaphragm layer 24 subsequently formed by performing photoresist coating, exposure, development, etching and photoresist stripping on the graphene film or super-aligned carbon nanotube film has good quality.

Figure 12:
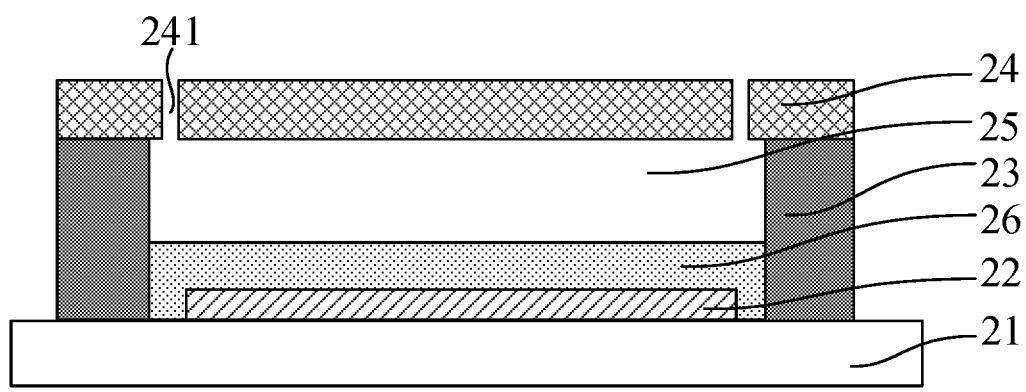
FIG. 12 shows a structural diagram after a sacrificial layer in the structure shown in FIG. 11 is removed.

As shown in FIG. 12, after the conductive diaphragm layer 24 is formed on the sacrificial layer 31, the sacrificial layer 31 is removed through the release holes 241. Specifically, the etching solution flows to the sacrificial layer 31 through the release holes 241 to perform wet etching on the sacrificial layer 31, so as to remove the sacrificial layer 31 to obtain the cavity 25.

Figure 13:
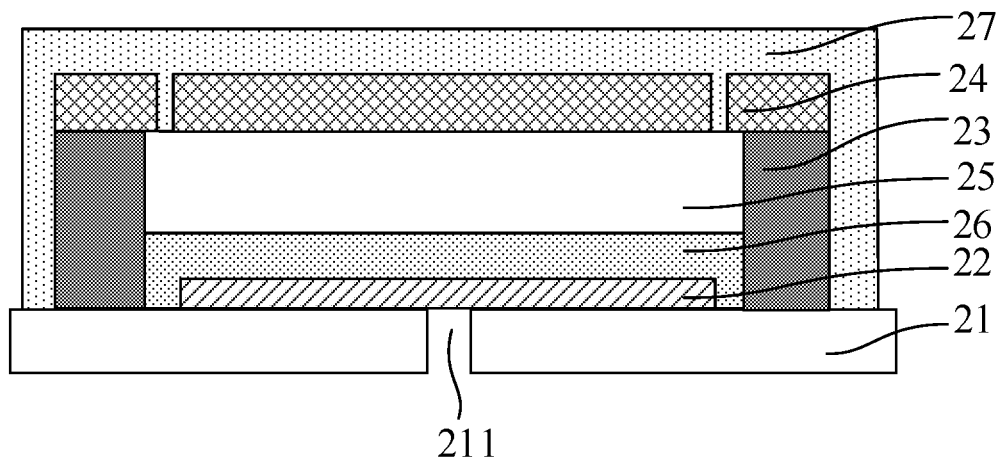
FIG. 13 shows a structural diagram after a passivation layer and a second through hole penetrating through a first substrate are formed on the structure shown in FIG. 12.

Further, after the sacrificial layer 31 is removed through the release holes 241, as shown in FIG. 13, a passivation layer 27 covering the conductive diaphragm layer 24 may be formed first, the passivation layer 27 fills the release holes 241, and the passivation layer 27 has a first through hole. Then, a first signal line is formed on a side, away from the conductive diaphragm layer 24, of the passivation layer 27, and the first signal line is connected with the conductive diaphragm layer 24 through the first through hole penetrating through the passivation layer 27.

In addition, after the sacrificial layer 31 is removed through the release holes 241, as shown in FIG. 13, a second through hole 211 penetrating through the first substrate 21 may be formed, then a second signal line 28 may be formed on a side, away from the first electrode 22, of the first substrate 21 to obtain the acoustic transduction unit as shown in FIG. 4, and the second signal line 28 is connected with the first electrode 22 through the second through hole 211.

In another alternative embodiment of the disclosure, step 603 comprises sub-steps 6034 to 6036:

Sub-step 6034, forming a conductive diaphragm layer on a second substrate;

Sub-step 6035, bonding the conductive diaphragm layer formed on the second substrate to a side, away from the first substrate, of the support layer; and Sub-step 6036, removing the second substrate.

Figure 14:
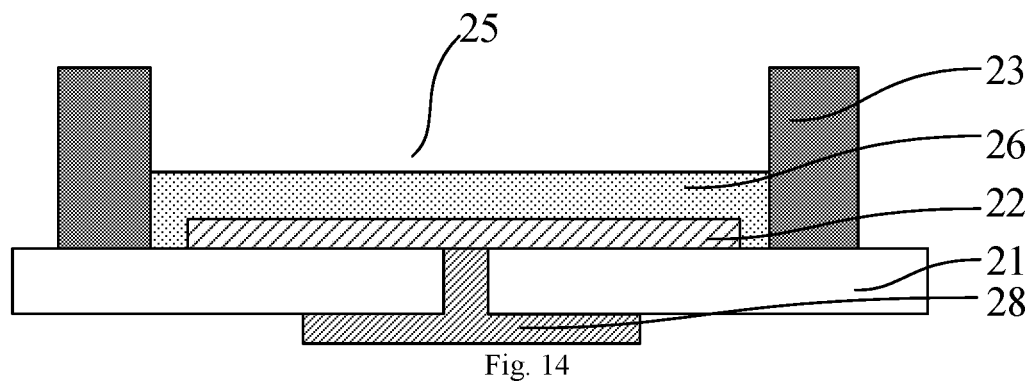
FIG. 14 shows a structural diagram after a second signal line is formed on the structure shown in FIG. 9.

As shown in FIG. 14, after the support layer 23 is formed on the side, close to the first electrode 22, of the first substrate 21, a second through hole penetrating through the first substrate 21 may be formed first, then a second signal line 28 may be formed on a side, away from the first electrode 22, of the first substrate 21, and the second signal line 28 is connected with the first electrode 22 through the second through hole.

Figure 15:
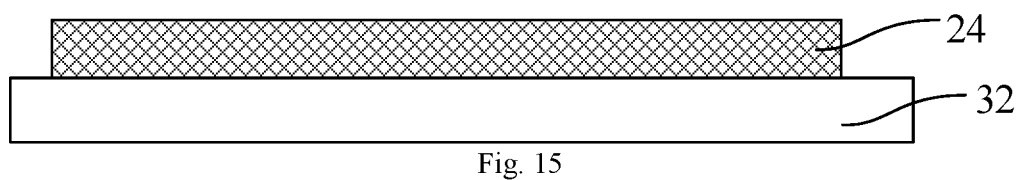
FIG. 15 shows a structural diagram after a conductive diaphragm layer is formed on a second substrate.

As shown in FIG. 15, a conductive diaphragm layer 24 is formed on the second substrate 32 by a single patterning process, and the second substrate 32 is a silicon-based substrate. The patterning process also comprises film coating (by a CVD process), photoresist coating, exposure, development, film etching, photoresist stripping and the like.

Figure 16:
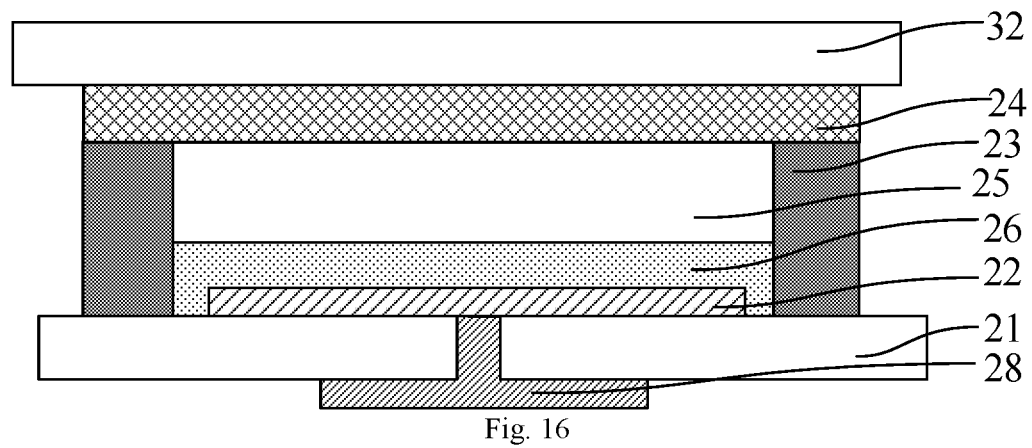
FIG. 16 shows a structural diagram after the structure shown in FIG. 14 is bonded with the structure shown in FIG. 15.

As shown in FIG. 16, after the first electrode 22 and the support layer 23 are formed on the first substrate 21 and the conductive diaphragm layer 24 is formed on the second substrate 32, the conductive diaphragm layer 24 formed on the second substrate 32 is bonded to a side, away from the first substrate 21, of the support layer 23 by a Silicon On Glass (SOG) process to form the conductive diaphragm layer 24 on the side, away from the first substrate 21, of the support layer 23. Specifically, the SOG process includes a hot-pressing bonding process or a chemical bonding process, etc.

It should be noted that when the conductive diaphragm layer 24 is formed on the side, away from the first substrate 21, of the support layer 23 by the SOG process, the sacrificial layer 31 does not need to be formed first, and the process of forming the conductive diaphragm layer 24 based on the sacrificial layer 31 and then removing the sacrificial layer 31 is avoided too. Accordingly, the conductive diaphragm layer 24 does not need to be provided with penetrated release holes 241.

After bonding the conductive diaphragm layer 24 formed on the second substrate 32 to the side, away from the first substrate 21, of the support layer 23, the second substrate 32 is stripped to obtain the structure shown in FIG. 3. Specifically, the second substrate 32 may be stripped by a laser stripping process, and of course, the second substrate 32 may also be stripped by other methods.

Optionally, after step 602, the method further comprises: forming a second through hole penetrating through the first substrate; and forming a second signal line on a side, away from the first electrode, of the first substrate, wherein the second signal line is connected with the first electrode through the second through hole.

In the actual manufacturing process, after the sacrificial layer 31 is removed through the release holes 241, the second through hole 211 penetrating through the first substrate 21 is formed, and then the second signal line 28 is formed on the side, away from the first electrode 22, of the first substrate 21. Alternatively, after the support layer 23 is formed on the side, close to the first electrode 22, of the first substrate 21, the second through hole penetrating through the first substrate 21 is formed, then the second signal line 28 is formed on the side, away from the first electrode 22, of the first substrate 21, and then the conductive diaphragm layer 24 is bonded to the support layer 23.

In the embodiment of the disclosure, by integrating the diaphragm layer and the second electrode in the acoustic transduction unit into one and allowing the conductive diaphragm layer to be used as both the diaphragm layer and the second electrode, a layer structure of the acoustic transduction unit is simple, so that the manufacturing steps of the acoustic transduction unit are simplified and production cost is reduced.

The embodiment of the disclosure also provides an acoustic transducer, comprising a plurality of above acoustic transduction units.

One may refer to the descriptions of the above embodiments for the specific description of the acoustic transduction unit, which may not be repeated here.

The plurality of acoustic transduction units in the acoustic transducer are distributed in an array, and the plurality of acoustic transduction units share the same first substrate 21. In addition, when the plurality of acoustic transduction units are formed on the first substrate 21, the same film layer in each acoustic transduction unit is formed by the same patterning process at the same time.

In addition, the number of second through holes provided on the first substrate 21 of the acoustic transducer is equal to the number of the acoustic transduction units, that is, the acoustic transduction units are in one-to-one correspondence to the second through holes.

In the embodiment of the disclosure, by integrating the diaphragm layer and the second electrode in the acoustic transduction unit into one and allowing the conductive diaphragm layer to be configured as both the diaphragm layer and the second electrode, a layer structure of the acoustic transduction unit is simple, so that the manufacturing steps of the acoustic transduction unit are simplified and production cost is reduced.

For the sake of simple description, all the aforementioned method embodiments are expressed as a series of action combinations, but those skilled in the art should know that the disclosure is not limited by the described action sequence, because according to the disclosure, some steps may be performed in other sequences or at the same time. Those skilled in the art should also know that the embodiments described in the specification are all preferred embodiments, and the actions and modules involved are not necessarily a must for the disclosure.

All the embodiments in this specification are described in a progressive way, and each embodiment focuses on the differences from other embodiments. The same and similar parts among the embodiments are referable to one another.

It should be also noted that herein, relational terms such as "first" and "second" are only used to distinguish one entity or operation from another entity or operation, and do not necessarily require or imply any such actual relationship or order between these entities or operations. The terms "comprise", "include" or any other variations thereof, are intended to cover a non-exclusive inclusion, such that a process, method, article, or device which includes a list of elements does not include only those elements but also other elements not expressly listed or inherent to such process, method, article, or device. Without further limitation, an element defined by the statement "includes a . . . " does not exclude the presence of another identical element in a process, method, article or device that includes the element.

The acoustic transduction unit, the manufacturing method thereof and the acoustic transducer provided by the disclosure are described in detail above. Specific examples are applied herein to illustrate the principle and implementation of the disclosure. The above embodiments are only used to help understand the method of the disclosure and its core ideas. For those of ordinary skill in the art, according to the idea of the disclosure, there may be some changes in the specific implementation and application scope. To sum up, the contents of this specification should not be understood as a limitation of the disclosure.

The invention claimed is:

1. An acoustic transduction unit, comprising a first substrate, a first electrode arranged on the first substrate, a support layer arranged on a side, close to the first electrode, of the first substrate, and a conductive diaphragm layer arranged on a side, away from the first substrate, of the support layer;
   wherein a cavity is enclosed by the support layer, overlapping areas exist between orthographic projections of the first electrode, the conductive diaphragm layer and the cavity on the first substrate, and
   the conductive diaphragm layer serves as both a diaphragm layer and a second electrode in the acoustic transduction unit;
   wherein the first substrate is provided with a second through hole; and
   the acoustic transduction unit further comprises a second signal line arranged on a side, away from the first electrode, of the first substrate, and the second signal line is connected with the first electrode through the second through hole.

2. The acoustic transduction unit according to claim 1, wherein the conductive diaphragm layer is made of graphene or super-aligned carbon nanotubes.

3. The acoustic transduction unit according to claim 1, wherein a thickness of the conductive diaphragm layer is 5 nm to 100 nm in a direction perpendicular to a plane where the first substrate is located.

4. The acoustic transduction unit according to claim 1, wherein a shape of the orthographic projection of the first electrode on the first substrate is at least one of a rectangle, a circle and a regular hexagon.

5. The acoustic transduction unit according to claim 1, wherein a shape of the orthographic projection of the supporting layer on the first substrate is at least one of a circular ring or a rectangular ring.

6. The acoustic transduction unit according to claim 1, wherein the acoustic transduction unit further comprises an isolation protective layer, and the isolation protective layer is arranged on a side, close to the conductive diaphragm layer, of the first electrode, and covers the first electrode.

7. The acoustic transduction unit according to claim 1, wherein the conductive diaphragm layer is provided with penetrated release holes, and orthographic projections of the release holes in the first substrate are located within the orthographic projection of the cavity on the first substrate.

8. The acoustic transduction unit according to claim 7, wherein the number of the release holes penetrating through the conductive diaphragm layer is at least one.

9. The acoustic transduction unit according to claim 7, wherein the acoustic transduction unit further comprises a passivation layer covering the conductive diaphragm layer, and the release holes are filled with the passivation layer; and the acoustic transduction unit further comprises a first signal line arranged on a side, away from the conductive diaphragm layer, of the passivation layer, and the first signal line is connected with the conductive diaphragm layer through a first through hole penetrating through the passivation layer.

10. The acoustic transduction unit according to claim 1, wherein an orthographic projection of the second through hole on the conductive diaphragm layer is located at a center of the conductive diaphragm layer.

11. A manufacturing method of an acoustic transduction unit according to claim 1, comprising:

forming the first electrode on the first substrate;
forming the support layer on the side, close to the first electrode, of the first substrate; and
forming the conductive diaphragm layer on the side, away from the first substrate, of the support layer.

12. The method according to claim 11, wherein the step of forming a conductive diaphragm layer on a side, away from the first substrate, of the support layer comprises:

forming a sacrificial layer on a side, away from the first substrate, of the first electrode;
forming a conductive diaphragm layer on the sacrificial layer, the conductive diaphragm layer being provided with penetrated release holes, and orthographic projections of the release holes in the first substrate being located within an orthographic projection of the sacrificial layer on the first substrate; and
removing the sacrificial layer through the release holes.

13. The method according to claim 11, wherein the step of forming a conductive diaphragm layer on a side, away from the first substrate, of the support layer comprises:

forming a conductive diaphragm layer on a second substrate;
bonding the conductive diaphragm layer formed on the second substrate to a side, away from the first substrate, of the support layer; and
removing the second substrate.

14. The method according to claim 11, wherein after forming a support layer on a side, close to the first electrode, of the first substrate, the method further comprises:

forming the second through hole penetrating through the first substrate; and
forming the second signal line on the side, away from the first electrode, of the first substrate.

15. An acoustic transducer, comprising a plurality of acoustic transduction units according to claim 1.

16. The acoustic transducer according to claim 15, wherein the conductive diaphragm layer is made of at least one of graphene or super-aligned carbon nanotubes.

17. The acoustic transducer according to claim 15, wherein a thickness of the conductive diaphragm layer is 5 nm to 100 nm in a direction perpendicular to a plane where the first substrate is located.

18. The acoustic transducer according to claim 15, wherein the acoustic transduction unit further comprises an isolation protective layer, and the isolation protective layer is arranged on a side, close to the conductive diaphragm layer, of the first electrode, and covers the first electrode.

19. The acoustic transducer according to claim 15, wherein the conductive diaphragm layer is provided with penetrated release holes, and orthographic projections of the release holes in the first substrate are located within the orthographic projection of the cavity on the first substrate.

* * * * *